United States Patent
Abe et al.

(10) Patent No.: US 8,006,553 B2
(45) Date of Patent: Aug. 30, 2011

(54) SEMICONDUCTOR SENSOR HAVING HEATER ON INSULATION FILM AND MANUFACTURING METHOD OF THE SAME

(75) Inventors: Ryuichirou Abe, Ichinomiya (JP);
Tsuyoshi Fukada, Aichi-gun (JP);
Keisuke Suzui, Okazaki (JP)

(73) Assignee: DENSO CORPORATION, Kariya (JP)

( * ) Notice: Subject to any disclaimer, the term of this patent is extended or adjusted under 35 U.S.C. 154(b) by 15 days.

(21) Appl. No.: 12/458,272

(22) Filed: Jul. 7, 2009

(65) Prior Publication Data

US 2010/0005877 A1   Jan. 14, 2010

(30) Foreign Application Priority Data

Jul. 10, 2008 (JP) ................................ 2008-179782
Jun. 4, 2009 (JP) ................................ 2009-135263

(51) Int. Cl.
*G01F 1/68* (2006.01)
(52) U.S. Cl. .................................................. 73/204.26
(58) Field of Classification Search ............... 73/204.22, 73/204.23, 204.25, 204.26, 204.11
See application file for complete search history.

(56) References Cited

U.S. PATENT DOCUMENTS

| | | | |
|---|---|---|---|
| 6,357,294 B1 | 3/2002 | Nakada | |
| 6,450,025 B1 | 9/2002 | Wado et al. | |
| 6,523,403 B1 * | 2/2003 | Fuertsch et al. | 73/204.26 |
| 6,550,325 B1 * | 4/2003 | Inushima et al. | 73/204.26 |
| 6,703,132 B1 | 3/2004 | Yasuda et al. | |
| 6,971,266 B2 * | 12/2005 | Kawai | 73/204.26 |
| 7,150,189 B2 * | 12/2006 | Tanaka et al. | 73/204.26 |
| 2002/0023487 A1 | 2/2002 | Yasukawa et al. | |
| 2002/0157463 A1 | 10/2002 | Kawai et al. | |
| 2003/0183000 A1 | 10/2003 | Yamada et al. | |
| 2005/0050953 A1 | 3/2005 | Yamada et al. | |
| 2005/0186696 A1 | 8/2005 | Yamada et al. | |
| 2007/0089504 A1 * | 4/2007 | Hanzawa et al. | 73/204.26 |

FOREIGN PATENT DOCUMENTS

| | | |
|---|---|---|
| JP | A-57-069781 | 4/1982 |
| JP | A-59-139679 | 8/1984 |
| JP | A-07-058346 | 3/1995 |
| JP | 07-243928 A | 9/1995 |
| JP | A-09-008326 | 1/1997 |
| JP | A-2001-012985 | 1/2001 |
| JP | A-2003-149025 | 5/2003 |
| JP | 2007-309914 A | 11/2007 |

OTHER PUBLICATIONS

Notice of Reasons for Refusal mailed on Feb. 1, 2011 issued from the Japanese Patent Office in the corresponding Japanese patent application No. 2009-135263 (and English translation).
Office Action mailed on May 17, 2011 issued in the corresponding Japanese Patent Application No. 2009-135263 (English translation enclosed).

* cited by examiner

*Primary Examiner* — Jewel Thompson
(74) *Attorney, Agent, or Firm* — Posz Law Group, PLC

(57) ABSTRACT

A sensor includes: a silicon substrate having a hollow portion, which is arranged on a backside of the substrate; an insulation film disposed on a front side of the substrate and covering the hollow portion; a heater disposed on the insulation film, made of a semiconductor layer, and configured to generate heat; and an anti-stripping film for protecting the insulation film from being removed from the silicon substrate. The silicon substrate, the insulation film and the semiconductor layer provide a SOI substrate. The hollow portion has a sidewall and a bottom. The anti-stripping film covers at least a boundary between the sidewall and the bottom of the hollow portion.

14 Claims, 9 Drawing Sheets

SEMICONDUCTOR SENSOR HAVING HEATER ON INSULATION FILM AND MANUFACTURING METHOD OF THE SAME

CROSS REFERENCE TO RELATED APPLICATIONS

This application is based on Japanese Patent Application No. 2008-179782 filed on Jul. 10, 2008, and No. 2009-135263 filed on Jun. 4, 2009, the disclosures of which are incorporated herein by reference.

FIELD OF THE INVENTION

The present invention relates to a semiconductor sensor having a heater on an insulation film, and a manufacturing method of a sensor.

BACKGROUND OF THE INVENTION

A semiconductor sensor includes a silicon substrate having a hollow portion, an insulation film covering the hollow portion and disposed on the front side of the substrate, and a heater generating heat by being energized and disposed on the insulation film. The heater is made of semiconductor layer.

The above sensor is disclosed in JP-A-H07-58346. The sensor is suitably used for a gas flow sensor for detecting gas flow amount. The gas flow sensor includes a hollow portion, a nitride film, a doped silicon film and a heater. The hollow portion is formed in a silicon substrate in such a manner that a back side of the substrate is etched. The nitride film is formed on a front side of the substrate, and covers the hollow portion. The doped silicon film is deposited on the nitride film. The heater is formed such that the doped silicon film is patterned to be a predetermined shape. The heater is energized so that the heater generates heat. When the gas flows through the heater, the gas conducts the heater away from the heater so that the electric resistance of the heater is changed. Based on the resistance change of the heater, the gas flow amount is detected.

Here, in a pressure sensor, a concavity is formed in a silicon substrate, and a bottom of the concavity provides a diaphragm. A sensing element is formed on the diaphragm. Thus, the diaphragm is not removed from the substrate. Accordingly, a part of the substrate, on which the sensing element is formed, has large mechanical strength.

In the above gas flow sensor, the heater as a sensing element is heated to generate the heat. Thus, it is necessary to heat the sensing element with small current for a short time. Accordingly, it is necessary to reduce heat capacity of a part of the device, on which the heater is formed. Further, it is necessary to increase insulation property of the part of the device. Thus, the part of the device provided by a film has small thickness. In this case, an insulation film made of a nitride film having a large thickness covers the hollow portion of the substrate, and the heater is formed on the nitride film.

However, stress may be applied from an opening of the hollow portion toward the bottom of the hollow portion. Specifically, when the gas flow sensor is arranged in an intake manifold of an internal combustion engine, the stress is generated. In this case, the stress may be caused by pulsation when backfire is caused. The stress is concentrated at a boundary between the sidewall and the bottom of the hollow portion.

Accordingly, the insulation film on the hollow portion may be removed from the silicon substrate, so that the strength of the part of the device, on which the heater is formed, is reduced.

Thus, it is required for the gas flow sensor to improve mechanical strength so that the insulation film at the boundary between the sidewall and the bottom of the hollow portion is not removed from the silicon substrate.

SUMMARY OF THE INVENTION

In view of the above-described problem, it is an object of the present disclosure to provide a sensor having a heater on an insulation film. It is another object of the present disclosure to provide a manufacturing method of a sensor having a heater on an insulation film.

According to a first aspect of the present disclosure, a sensor includes: a silicon substrate having a hollow portion, which is arranged on a backside of the substrate; an insulation film disposed on a front side of the substrate and covering the hollow portion; a heater disposed on the insulation film, made of a semiconductor layer, and configured to generate heat; and an anti-stripping film for protecting the insulation film from being removed from the silicon substrate. The silicon substrate, the insulation film and the semiconductor layer provide a SOI substrate. The hollow portion has a sidewall and a bottom, and the anti-stripping film covers at least a boundary between the sidewall and the bottom of the hollow portion.

In the above sensor, even if stress is applied to the hollow portion, the stress is reduced by the anti-stripping film. Accordingly, the insulation film is hardly removed from the substrate, and thereby, the mechanical strength of the sensor is improved.

According to a second aspect of the present disclosure, a manufacturing method of a sensor includes: preparing a SOI substrate having a silicon substrate, an insulation layer and a semiconductor layer, which are stacked in this order; forming a heater in the semiconductor later so that the heater is arranged on the insulation layer; forming a mask on a backside of the silicon substrate; etching the backside of the silicon substrate via the mask so that a hollow portion is formed on the backside of the silicon substrate; and forming an anti-stripping film on a boundary between a sidewall and a bottom of the hollow portion. The insulation layer is disposed on a front side of the silicon substrate, and covers the hollow portion. The heater is configured to generate heat, and the anti-stripping film protects the insulation layer from being removed from the silicon substrate.

In the above method, even if stress is applied to the hollow portion, the stress is reduced by the anti-stripping film. Accordingly, the insulation film is hardly removed from the substrate, and thereby, the mechanical strength of the sensor is improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
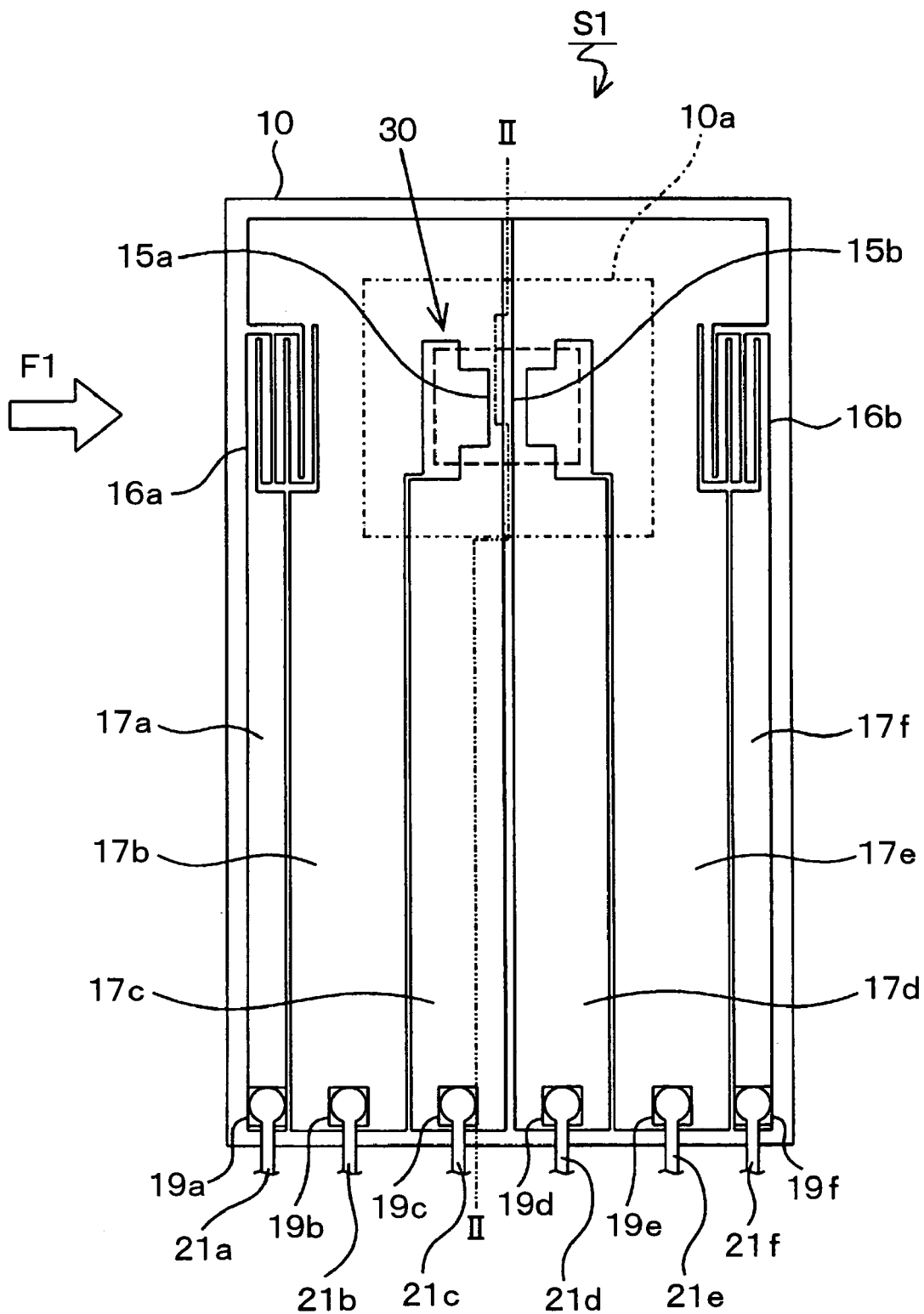
FIG. 1 is a diagram showing a plan view of a thermal type gas flow sensor according to a first embodiment.
Figure 2:
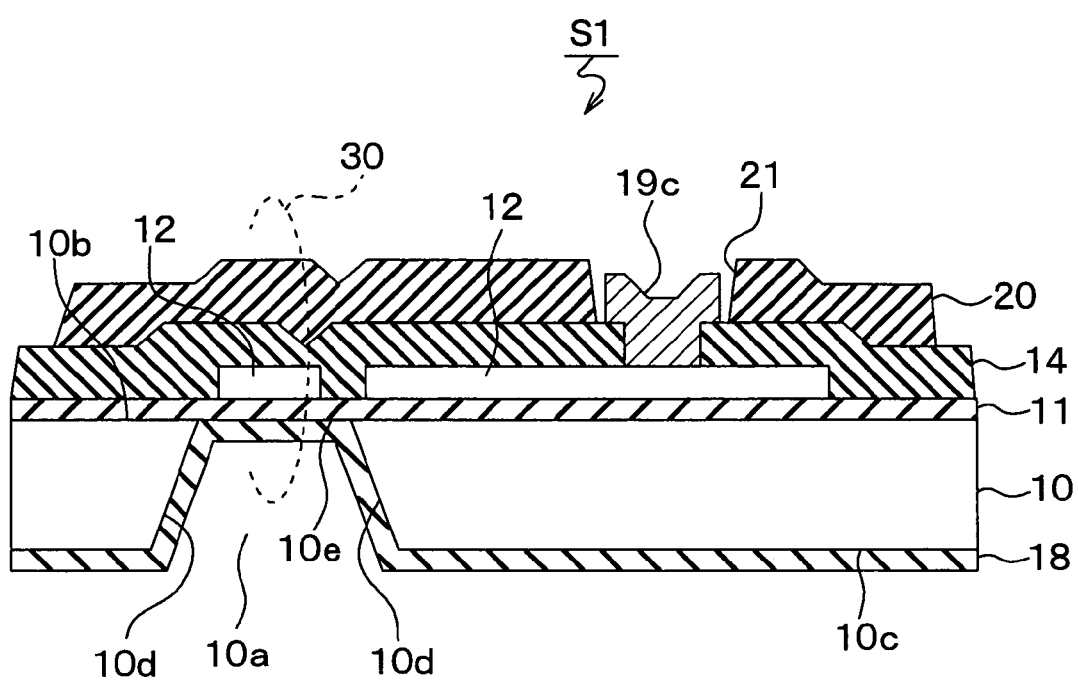
FIG. 2 is a diagram showing a cross sectional view of the gas flow sensor taken along line II-II in FIG. 1.

A sensor according to a first embodiment includes a heater on an insulation film. The sensor is suitably used for a thermal type gas flow sensor S1 for detecting gas flow amount of gas. FIG. 1 shows a plan views of the gas flow sensor S1. In FIG. 2, a thickness of each layer is enlarged from an actual thickness so that the structure of the sensor S1 is easily understandable.

The structure of the senor S1 will be explained.

In FIG. 1, an arrow F1 shows a direction, to which the gas as a detection object flows. The sensor S1 includes heat generation resistors 15a, 15b as a heater made of a semiconductor layer 12. One resistor 15a is disposed on an up stream side of the gas flow, and the other resistor 15b is disposed on a down stream side of the gas flow. The resistors 15a, 15b are heated up to, for example, temperature in a range between 100° C. and 400° C.

A pair of heat generation resistors 15a, 15b provides a sensing element as a detection portion. The sensor S1 further includes a pair of gas flow temperature resistors 16a, 16b made of a semiconductor layer. Each resistor 16a, 16b detects environmental temperature around the sensor S1.

The sensor S1 further includes wiring layers 17a-17f made of a semiconductor layer. Each wiring layer 17a-17f electrically connects among the temperature resistor 16a, the heat generation resistor 15a, the heat generation resistor 15b, and the temperature resistor 16b. Further, each wiring layer 17a-17f is electrically coupled with a pad, respectively 19a-19f. Each pad 19a-19f is electrically coupled with bonding wires 21a-21f.

The heat generation resistor 15a, 15b is electrically coupled with a control circuit (not shown) via the wiring layers 17b, 17e, the pads 19b-19e and the bonding wires 21b-21e. The current flows from the control circuit to the heat generation resistors 15a, 16b via the bonding wires 21b-21e, the pads 19b-19e and the wiring layers 17b-17e so that the resistors 15a, 15b generate heat.

The gas flow temperature resistors 16a, 16b are electrically coupled with a temperature detection circuit (not shown) via the wiring layers 17a, 17f, the pads 19a, 19f and the bonding wires 21a, 21f, respectively. The current flows from the temperature detection circuit to the gas flow temperature resistors 16a, 16b via the bonding wires 21a, 21f, the pads 19a, 19f and the wiring layers 17a, 17f.

In FIG. 2, the sensor S1 is formed from a silicon substrate 10 as a base substrate. A hollow portion 10a is formed in the substrate 10, and a part of the substrate, at which the hollow portion 10a is formed, provides a membrane 30 as a thin portion or a thin film structure.

The hollow portion 10a penetrates from the front side 10b of the silicon substrate 10 to the back side 10c of the substrate 10. Specifically, the hollow portion 10a opens on the back side 10c of the substrate 10. The hollow portion 10a is provided by a concavity on the back side 10c of the substrate 10 so that the back side 10c is concaved toward the front side 10b.

A silicon oxide film 11 is formed on the front side 10b of the substrate 10. The silicon oxide film 11 is made of silicon and oxygen. For example, the silicon oxide film 11 may be a $SiO_2$ film, a $SiO_xN_y$ film, or porous silica.

The semiconductor layer 12 is formed on the surface of the silicon oxide film 11. The semiconductor layer 12 provides the heat generation resistors 15a, 15b, the gas flow temperature resistors 16a, 16b and the wiring layers 17a-17f.

The silicon substrate 10, the silicon oxide film 11 and the semiconductor layer 12 may be formed from a SOI substrate having a support substrate as the silicon substrate 10, an embedded layer (i.e., a BOX layer) as the silicon oxide film 11 and a SOI layer as the semiconductor layer 12.

The semiconductor layer 12 is sealed with a BPSG film 14, and a silicon nitride film 20 covers the BPSG film 14. Thus, the surface of the sensor S1 is covered with an insulation film of the BPSG film 14 and the silicon nitride film 20.

The BPSG film 14 and the silicon nitride film 20 have contact holes 21, which correspond to the wiring layers 17a-17f. The contact holes 21 penetrate the BPSG film 14 and the silicon nitride film 20. The pads 19a-19f are electrically coupled with the wiring layers 17a-17f via the contact holes 21.

A silicon nitride film 18 is formed on the sidewall 10d and the bottom 10e of the hollow portion 10a and the back side 10c of the silicon substrate 10. The silicon nitride film 18 functions as an anti-stripping film (i.e., a peeling-off prevention film). Thus, the silicon nitride film 18 is formed on the back side of the sensor S1.

Thus, even when stress is applied so that the membrane 30 is deformed upwardly, the silicon nitride film 18 reduces the stress.

Thus, the silicon oxide film 11 is not substantially removed from the substrate 10 at the boundary between the sidewall 10d and the bottom 10e of the hollow portion 10a. Thus, the mechanical strength of the sensing portion is improved.

Further, the heat generated in the heat generation resistors 15a, 15b conducts the silicon oxide film 11 so that the silicon oxide film 11 is heated. In the silicon oxide film 11, a Na atom, a $H_2O$ molecule and a OH group (i.e., a hydroxyl group) may be thermally diffused. However, the silicon nitride film 18 prevents from diffusion of those matters.

Accordingly, the resistivity of the heat generation resistors 15a, 15b is not changed, and the detection accuracy of the gas flow amount is not reduced.

Further, since the silicon nitride film 18 is formed on the back side of the sensor S1, foreign material such as heavy metal is prevented from penetrating into the silicon oxide film 11. Thus, the foreign material does not affect the resistivity of the resistors 15a, 15b.

A manufacturing method of the sensor S1 will be explained as follows. FIGS. 3A to 4B shows the manufacturing method of the sensor S1.

Figure 3A:
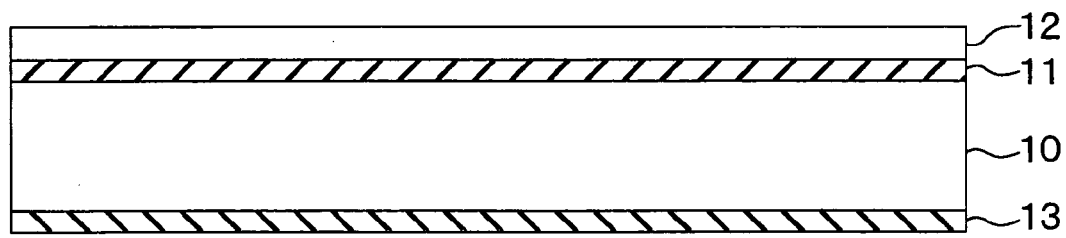
FIGS. 3A to 5B are diagrams showing a manufacturing method of the gas flow sensor in FIG. 1.

(Step in FIG. 3A)

The SOI substrate having the silicon substrate 10 as the support substrate, the silicon oxide film 11 as the BOX layer and the semiconductor layer 12 as the SOI layer is prepared. The silicon oxide film 13 is formed on the back side of the silicon substrate 10. A donor impurity such as P, As, Sb or the like or an acceptor impurity such as B, Al or the like is doped in the semiconductor layer 12 so that the layer 12 has a predetermined resistivity.

If necessary, after the ion implantation, an anneal process may be performed so that the doped impurity is diffused and activated. Specifically, if a latter heat process is not sufficient, the anneal process is performed. Instead of the ion implantation, a deposition method may be performed to dope the impurity. Alternatively, before forming the silicon oxide film 13, an impurity may be doped in the semiconductor layer 12 so that the resistivity of the semiconductor layer 12 is controlled to be a predetermined resistivity. A thickness of the substrate 10 is, for example, 500 microns to 600 microns. The impurity concentration of the semiconductor layer 12 is in a range between $1\times10^{19}/cm^3$ and $1\times10^{21}/cm^3$.

Figure 3B:
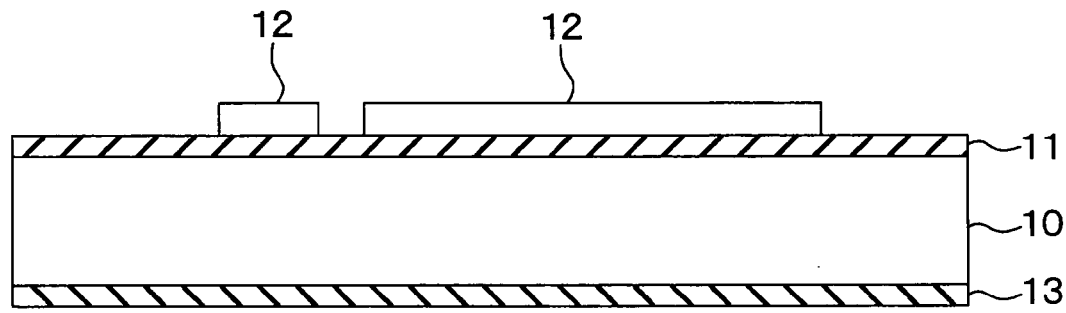

(Step in FIG. 3B)

Next, the semiconductor layer 12 is etched so that the heat generation resistors 15a, 15b, the gas flow temperature resistors 16a, 16b and the wiring layers 17a-17f are formed.

Figure 3C:
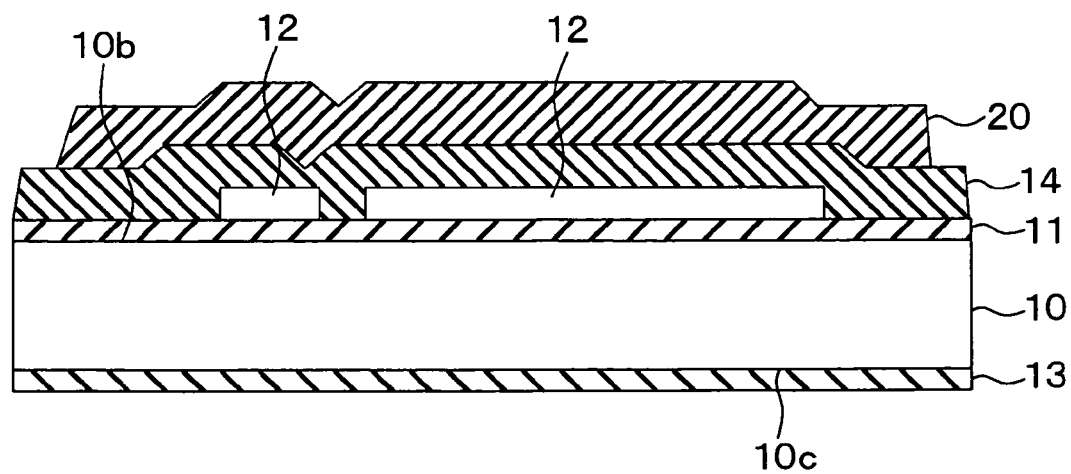

(Step in FIG. 3C)

Then, when it is necessary to remove the damage in the semiconductor layer 12 caused by the etching, the semiconductor layer 12 is thermally oxidized. After that, the BPSG film 14 is formed on the semiconductor layer 12 by a CVD method. Then, thermal process is performed so that a step on the semiconductor layer 12 is smoothed. An oxide film other than the BPSG film may be formed on the semiconductor layer 12. The silicon nitride film 20 is formed on the BPSG film 14 by a plasma CVD method, a decompression CVD method or a sputtering method.

Figure 4A:
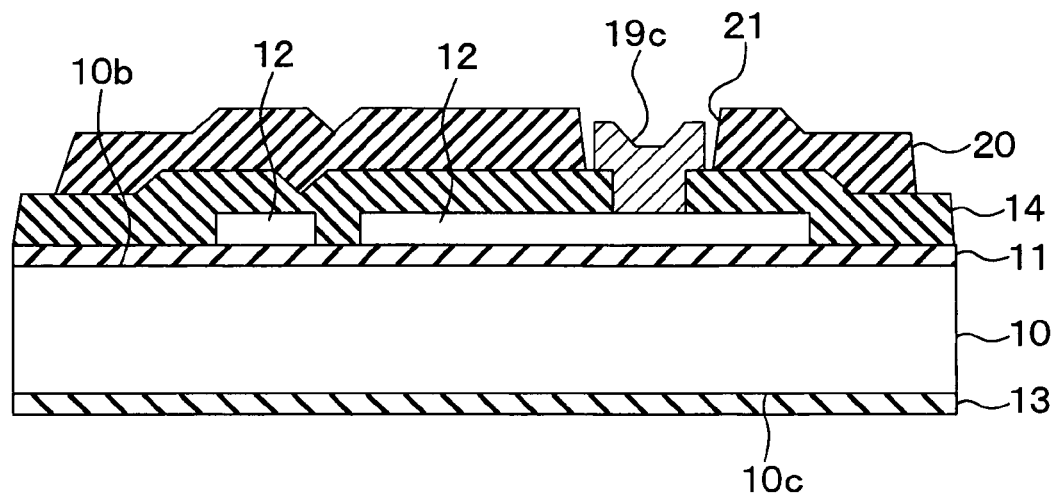

(Step in FIG. 4A)

The silicon nitride film 20 and the BPSG film 14 are etched so that the contact holes 21 are formed to penetrate the films 20, 14. Then, aluminum is embedded in the contact holes 21. The surface of the embedded aluminum material is etched, so that the pads 19a-19f are formed.

Figure 4B:
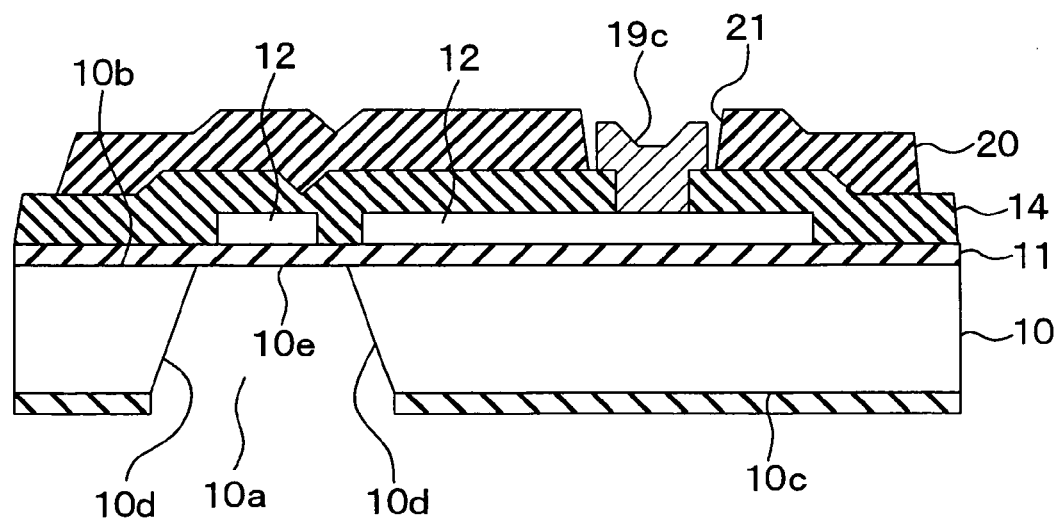

(Step in FIG. 4B)

The back side of the substrate 10 is polished so that the back side of the substrate 10 is smoothed. The silicon nitride film 13a is formed on the smoothed back side of the substrate 10 by the CVD method. Thus, the silicon nitride film 13a functions as a masking film for latter performed etching process. If the silicon nitride film 13a is formed on a damaged surface such as a surface having a concavity and a convexity or a scratched surface, the etching surface cannot be smoothed. Thus, after the damaged surface is smoothed, the silicon nitride film 13a is formed.

Then, the silicon nitride film 13a is etched so that the opening of the hollow portion 10a is formed. The back side of the silicon substrate 10 is anisotropically etched with using a KOH etchant so that the hollow portion 10a is formed. For example, the opening of the hollow portion 10a has a square shape of one millimeter square.

Figure 5A:
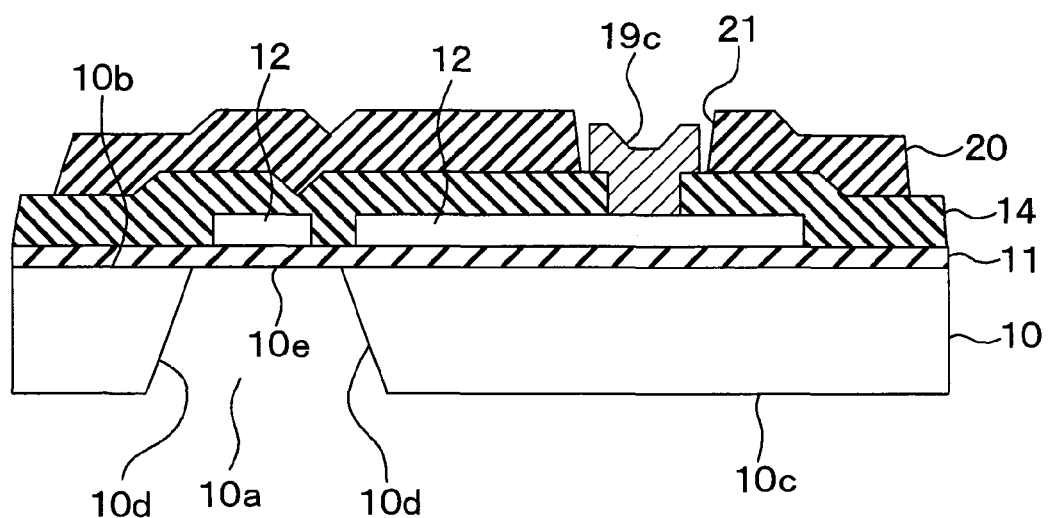

(Step in FIG. 5A)

Figure 6A:
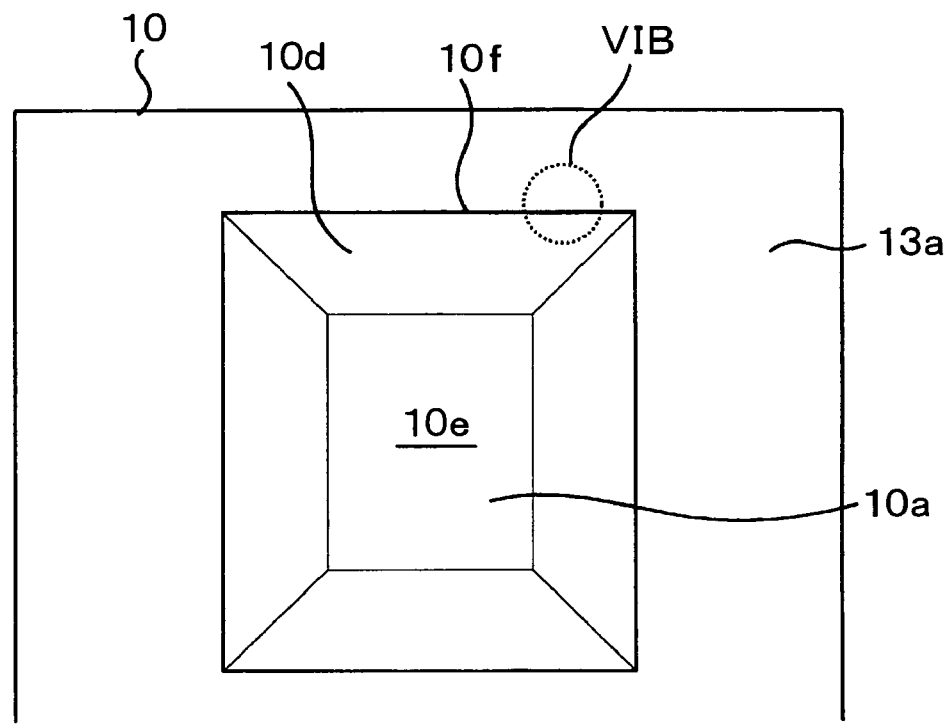
FIG. 6A is a diagram showing a backside view of a hollow portion in the sensor.
Figure 6B:
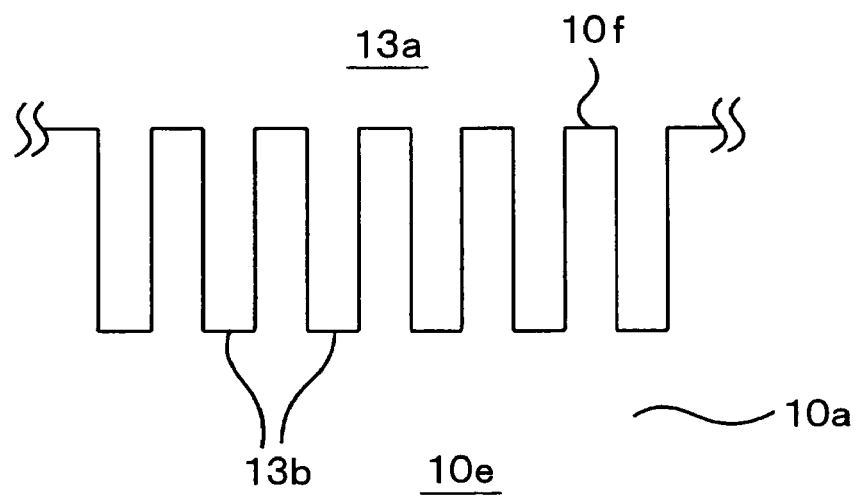
FIG. 6B is a diagram showing a partially enlarged view of a part IVB of the hollow portion in FIG. 6A.

The silicon nitride film 13a on the back side of the substrate 10 is removed by a dry etching method, a wet etching method or a polishing method. FIG. 6A shows a back side of the hollow portion 10a, and FIG. 6b shows a part VIB of the hollow portion 10a. When the silicon nitride film 13a is etched, the film 13a is etched along with not only the thickness direction of the silicon nitride film 13a but also a direction perpendicular to the thickness direction.

Accordingly, as shown in FIG. 6B, a corrugation 13b of the silicon nitride film 13a may be formed such that the corrugation 13b protrudes from a periphery 10f of the hollow portion 10a toward a concavity of the hollow portion 10a. When the corrugation 13b is broken, and a particle of the corrugation 13b is attached to the silicon oxide film 11 on the bottom 10e of the hollow portion 10a, the resistivity of the heat generation resistors 15a, 15b may be changed. Thus, the detection accuracy of the gas flow amount is reduced. Thus, in the step in FIG. 5A, the silicon nitride film 13a is removed so that the particle of the corrugation 13b is not generated.

Figure 5B:
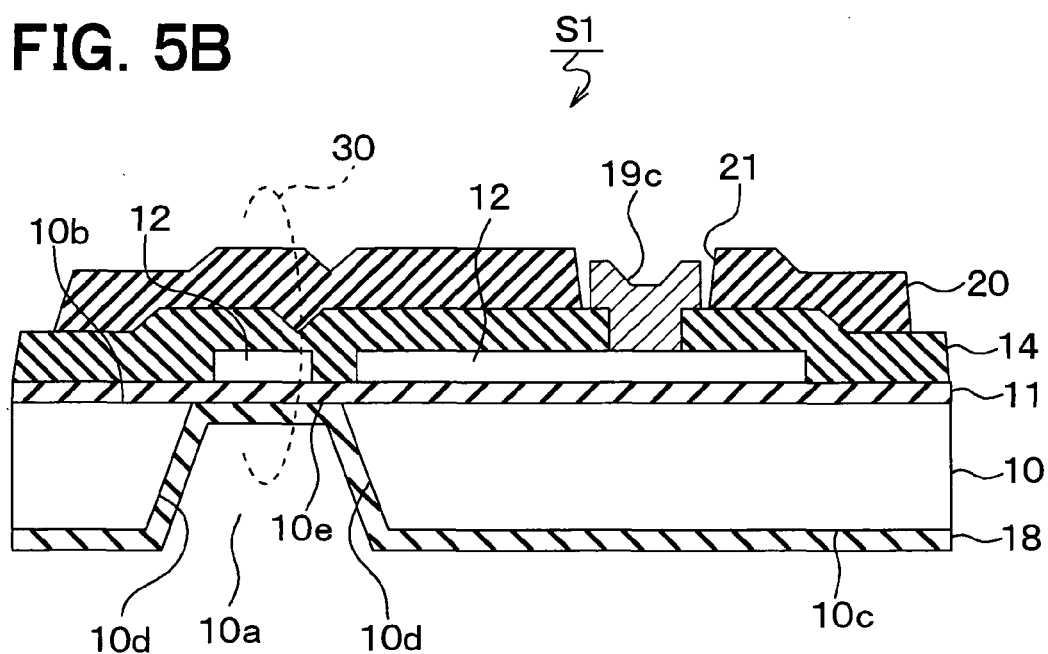

(Step in FIG. 5B)

Then, the silicon nitride film 18 is formed on the sidewall 10d and the bottom 10e of the hollow portion 10a and the back side 10c of the substrate 10. The silicon nitride film 18 is formed by the plasma CVD method, the decompression CVD method or the sputtering method. The thickness of the film 18 is in a range between 0.1 microns and 2.0 microns. In view of the latter explanation, when the thickness of the silicon nitride film 18 is equal to or larger than 0.1 microns, the silicon oxide film 11 is prevented from being removed. Further, variation of the resistivity of the heat generation resistors 15a, 15b becomes small. When the thickness of the silicon nitride film 18 is in a range between 0.35 microns and 2.0 microns, the variation of resistivity of the resistors 15a, 15b is much reduced.

Here, when the silicon nitride film 18 is formed by the CVD method, reaction gas can be introduced on the sidewall 10d and the bottom 10e of the hollow portion 10a uniformly. Thus, the silicon nitride film 18 is formed on the inner wall of the hollow portion 10a homogeneously. Further, since the growth rate of the silicon nitride film 18 is large, the productivity of the sensor S1 is increased. Furthermore, the silicon nitride film 18 can be grown on a predetermined selected region since the silicon nitride film 18 is formed with chemical reaction.

Compression stress is inherent in at least the silicon oxide film 11 and the BPSG film 14. Thus, the compression stress is applied to the silicon nitride film 18.

However, since the silicon nitride film 18 is formed by the decompression CVD method, tensile stress is generated in the silicon nitride film 18 inherently. The tensile stress absorbs the compression stress applied to the silicon nitride film 18.

Accordingly, possibility of compression buckling of the silicon nitride film 18 with the compression stress is reduced. Thus, in view of protection from the compression buckling, it is preferable to form the silicon nitride film 18 by the decompression CVD method.

When the silicon nitride film 18 is formed by the sputtering method, the silicon nitride film 18 having high adhesiveness is formed. Further, in this case, the thickness of the silicon nitride film 18 can be controlled with high accuracy. Furthermore, material usability for forming the silicon nitride film 18 is increased.

Then, the structure shown in FIG. 5B is dipped in a constant temperature chamber so that the structure is thermally processed. Thus, electric charge accumulated in each part of the structure is removed. Thus, the sensor S1 is completed. In view of the latter explanation, when the silicon nitride film 18 is thermally processed at a predetermined temperature for a predetermined time, for example, at 450° C. for 20 minutes, the variation of resistivity of the resistors 15a, 15b is much reduced, compared with a case where the silicon nitride film 18 is not thermally processed.

The operation of the sensor S1 will be explained.

The heat generation resistors 15a, 15b are driven by the control circuit (not shown). The control circuit is electrically connected to a measurement circuit (not shown). The temperature of the resistors 15a, 15b are controlled by the control circuit to be higher by a predetermined temperature such as 200° C. than temperature detected by the gas flow temperature resistors 16a, 16b.

The gas flow absorbs the heat of the resistors 15a, 15b so that the temperature of the resistors 15a, 15b is reduced. Here, the absorbance of heat depends on the gas flow amount. Thus, the gas flow amount is related to the electric resistance. The control circuit controls the temperature of the resistors 15a, 15b to be constant. Specifically, the control circuit controls the current flowing through the resistors 15a, 15b so that the temperature of the resistors 15a, 15b is constant. The measurement circuit detects current change in the control circuit so that the measurement circuit retrieves the current change as an electric signal. Based on the signal of the measurement circuit, the gas flow amount is calculated.

The gas having high temperature flows through the heat generation resistor 15b disposed on the down stream side of the gas flow, and the gas having comparatively low temperature flows through the heat generation resistor 15a disposed on the up stream side of the gas flow. Thus, heat amount lost from the heat generation resistor 15b disposed on the down stream side is smaller than that from the heat generation resistor 15a disposed on the up stream side. Accordingly, to equalize the temperature of both resistors 15a, 15b, it is necessary to flow the current largely through the heat generation resistor 15a disposed on the up stream side, compared with the current flowing through the heat generation resistor 15b disposed on the down stream side. Thus, based on difference of current between the resistors 15a, 15b, the flowing direction of gas can be detected.

For example, when the gas flows along with the arrow F1 in FIG. 1, the heat of the heat generation resistor 15a disposed on the up stream side is lost larger than that of the heat generation resistor 15b disposed on the down stream side. The control circuit controls to increase the current flowing through the heat generation resistor 15a disposed on the up stream side so that the temperature of the heat generation resistor 15a is maintained to be constant. The gas passing through the heat generation resistor 15a disposed on the up stream side is heated by the heat generation resistor 15a. The heated gas passes through the heat generation resistor 15b disposed on the down stream side, and thereby, the heat radiation from the heat generation resistor 15b to the gas is reduced. Thus, the control circuit controls to reduce the current flowing through the heat generation resistor 15b disposed on the down stream side.

Based on the current energization to the heat generation resistors 15a, 15b, the sensor S1 can detect the gas flow amount and the flowing direction of the gas.

The present inventors have performed experiment about breakdown strength of the membrane 30. The sensor S1 having the silicon nitride film 18 as the anti-stripping film of the silicon oxide film 11 and a sensor S1 without the anti-stripping film are tested. Further, the thickness of the silicon nitride film 18 is varied from 0.1 microns, 0.2 microns, 0.35 microns, 0.5 microns, 1.3 microns and 2.0 microns. The silicon nitride film 18 is formed by the plasma CVD method. The thickness of the silicon substrate 10 is 500 microns. The thickness of the silicon oxide film 11 is 0.5 microns.

Further, the opening of the hollow portion 10a in the sensor S1 is covered with a plate having a hole. Air is introduced into the hollow portion via the hole of the plate so that air pressure is applied to the membrane 30 in the thickness direction, i.e., the up-down direction of the substrate 10. The pressure at which the membrane 30 is broken is detected. Specifically, when the silicon oxide film 11 is removed from the substrate 10, it is determined that the membrane 30 is broken.

Figure 7:
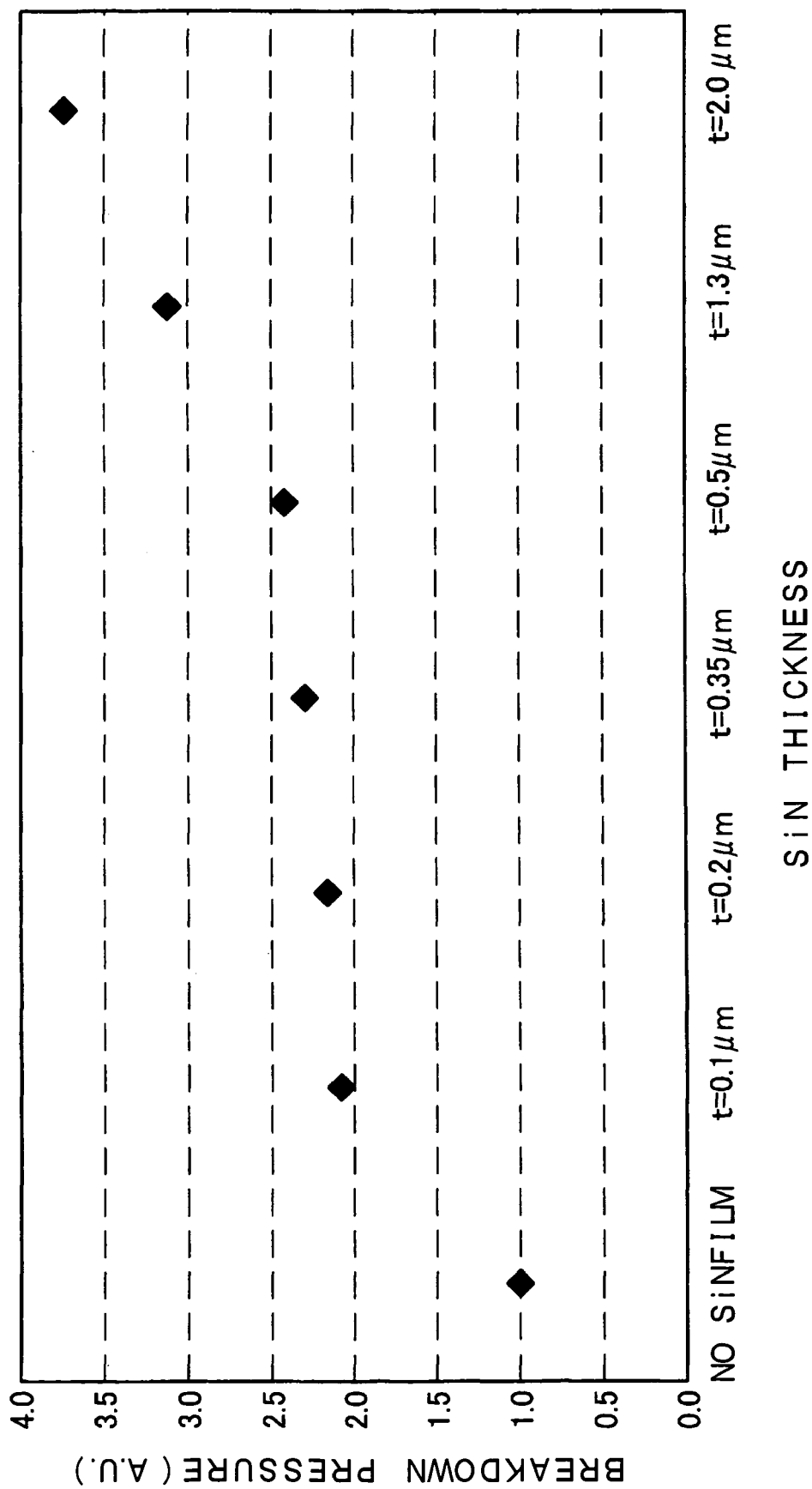
FIG. 7 is a graph showing a result of an experiment No. 1.

FIG. 7 shows a result of the above experiment. The vertical axis of the graph in FIG. 7 represents the breakdown pressure at which the membrane is broken. The unit of the vertical axis is arbitrary magnitude, i.e., arbitrary unit (A. U.). The horizontal axis of the graph in FIG. 7 represents the thickness of the silicon nitride film 18. The breakdown pressure in a case where the sensor has the silicon nitride film 18 is larger than that in a case where the sensor has no silicon nitride film 18. Thus, the breakdown strength of the membrane 30 in a case where the sensor S1 has the silicon nitride film 18 as the anti-stripping film is larger than that in a case where the sensor has no silicon nitride film 18.

When the thickness t of the silicon nitride film 18 is 0.1 μm, the breakdown strength of the membrane 30 is twice or more larger than that of the sensor having no silicon nitride film. The thicker the thickness of the silicon nitride film 18, the larger the breakdown strength of the membrane 30. When the thickness of the silicon nitride film is 2.0 μm, the breakdown strength of the membrane 30 is three-and-a-half times or more larger than that of the sensor having no silicon nitride film.

The present inventors have performed experiment about a relationship between the thickness of the silicon nitride film 18 and the change rate of resistivity of the heat generation resistors 15a, 15b. The sensor S1 having the silicon nitride film 18 as the anti-stripping film of the silicon oxide film 11 and a sensor S1 without the anti-stripping film are tested.

The thickness of the silicon nitride film 18 is varied from 0.1 μm, 0.2 μm, 0.35 μm, 0.5 μm, 1.3 μm and 2.0 μm. The silicon nitride film 18 is formed by the plasma CVD method. The thickness of the silicon substrate 10 is 500 μm. The thickness of the silicon oxide film 11 is 0.5 μm.

The sensor S1 is accommodated in a constant temperature chamber to perform endurance test so that the temperature of the sensor S1 is maintained at 280° C. for 1500 hours. The resistivity of the resistors 15a, 15b in each sensor S1 before the endurance test and after the endurance test is measured.

Figure 8:
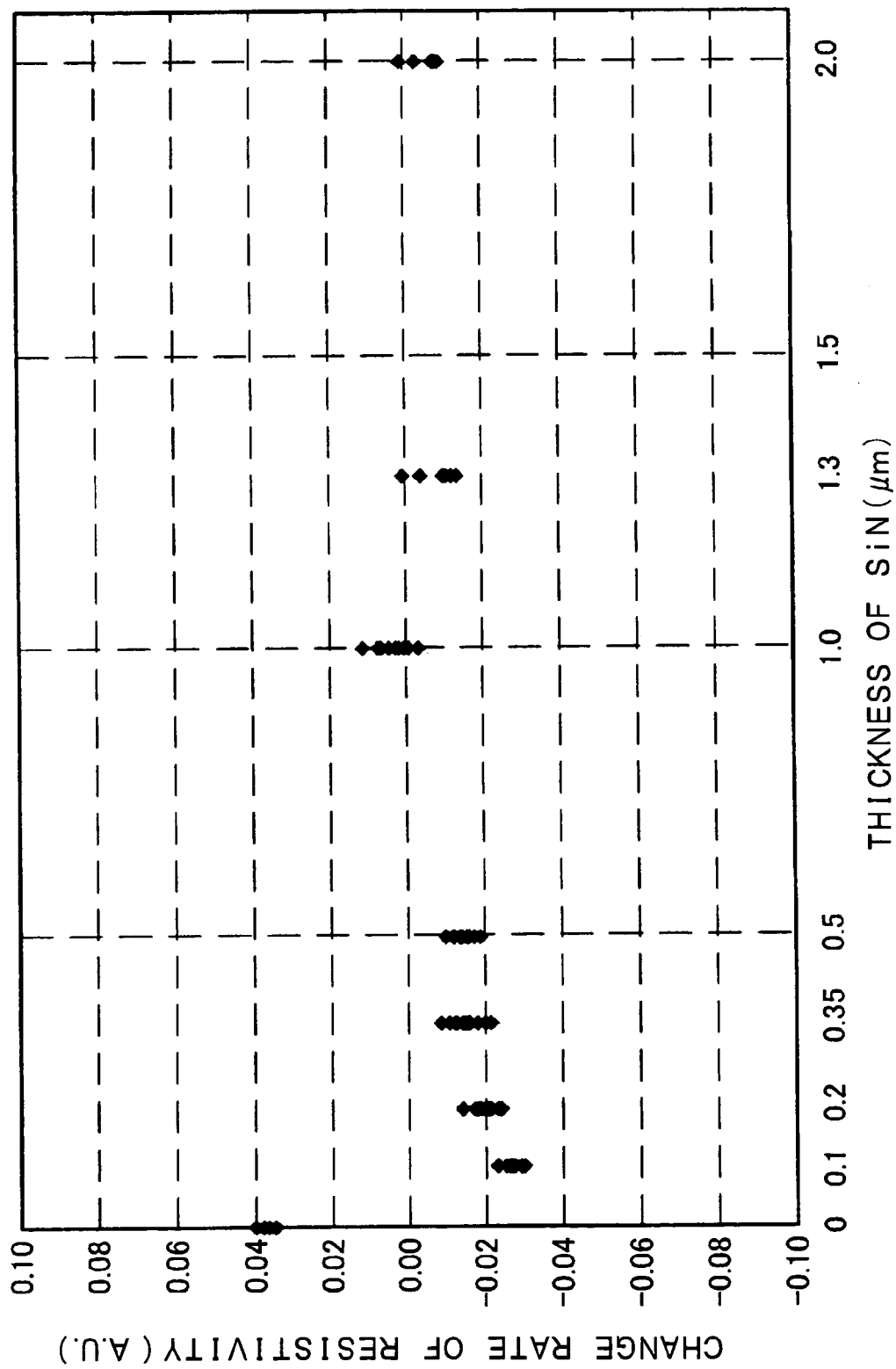
FIG. 8 is a graph showing a result of an experiment No. 2.

FIG. 8 shows a result of the above experiment, and represents a relationship between the change rate of resistivity and the thickness of the silicon nitride film 18. The change rate of resistivity shows a difference of resistivity before the endurance test and after the endurance test. The unit of the change rate of resistivity is arbitrary magnitude. When the thickness of the silicon nitride film 18 is zero, the sensor has no silicon nitride film 18.

The change rate of resistivity in the sensor S1 having the silicon nitride film 18 is smaller than that in the sensor S1 having no silicon nitride film 18. Further, as the thickness of the silicon nitride film 18 larger from 0.1 μm to 2.0 μm, the change rate of resistivity smaller. Specifically, when the thickness of the silicon nitride film 18 is equal to or larger than 0.35 μm, the change rate of resistivity is equal to or smaller than 0.01.

Accordingly, when the silicon nitride film 18 is formed on the inner wall of the hollow portion 10a in the silicon substrate 10, the change rate of resistivity of the resistors 15a, 15b is reduced. Specifically, the silicon nitride film 18 prevents a Na atom, a $H_2O$ molecule and a OH group from diffusing. A fixation charge as a cause of resistivity change is prevented from being generated. When the thickness of the silicon nitride film 18 is in a range between 0.1 μm and 2.0 μm, the change rate of resistivity of the resistors 15a, 15b is equal to or smaller than 0.03. Specifically, when the thickness of the silicon nitride film 18 is in a range between 0.35 μm and 2.0 μm, the change rate of resistivity of the resistors 15a, 15b is equal to or smaller than 0.01.

The present inventors have performed experiment about influence of heat treatment on the resistivity change of the resistors 15a, 15b.

The sensor S1 having the silicon nitride film 18 as the anti-stripping film of the silicon oxide film 11 and a sensor S1 without the anti-stripping film are tested. Further, the thickness of the silicon nitride film 18 is 0.5 microns or 1.3 microns. The silicon nitride film 18 is formed by the plasma CVD method. The thickness of the silicon substrate 10 is 500 microns. The thickness of the silicon oxide film 11 is 0.5 microns.

The heat treatment is performed at 350° C. for 20 minutes, at 400° C. for 20 minutes, at 450° C. for 20 minutes, or at 450° C. for 10 minutes. After the heat treatment, the sensor S1 is accommodated in a constant temperature chamber to perform endurance test so that the temperature of the sensor S1 is maintained at 280° C. for 1500 hours. The resistivity of the resistors 15a, 15b in each sensor S1 before the endurance test and after the endurance test is measured. The change rate of resistivity is determined.

Figure 9:
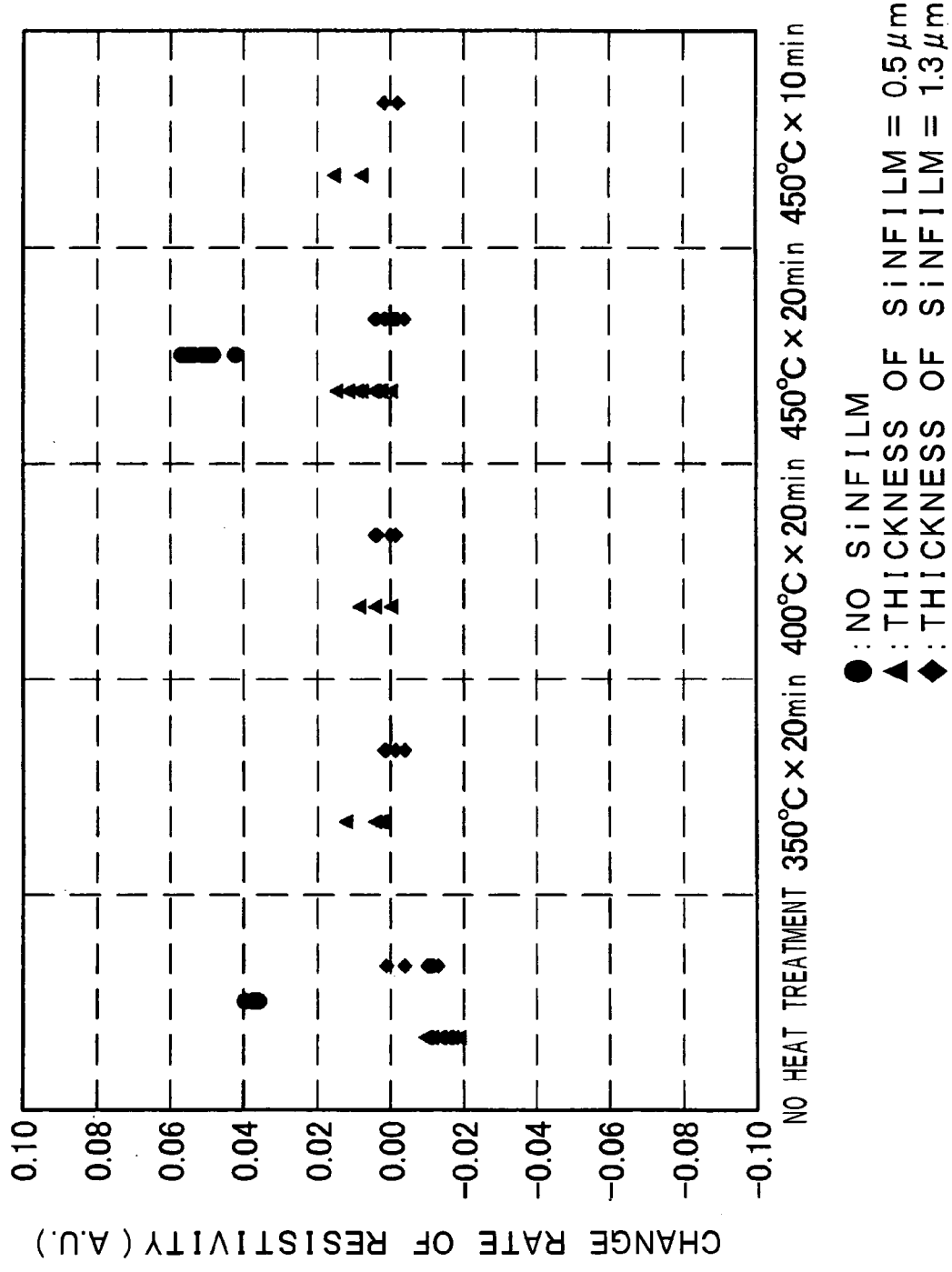
FIG. 9 is a graph showing a result of an experiment No. 3.

FIG. 9 shows a result of the above experiment. A black circle represents the change rate of resistivity in the sensor S1 having no silicon nitride film 18. A black triangle represents the change rate of resistivity in the sensor S1 having the silicon nitride film 18 with the thickness of 0.5 microns. A black rhomboid represents the change rate of resistivity in the sensor S1 having the silicon nitride film 18 with the thickness of 1.3 microns.

Compared with the result shown in FIG. 8, when the heat treatment is performed, the change rate of resistivity becomes much smaller.

When the sensor S1 having the silicon nitride film 18 is thermally processed, a charge accumulated in each layer is removed, so that the change rate of resistivity becomes much smaller.

(Modifications)

In the above embodiment, the silicon nitride film 18 is formed on a whole surface of the back side of the substrate 10 and the sidewall 10d and the bottom 10e of the hollow portion 10a. Alternatively, the silicon nitride film 18 may be formed on only the sidewall 10d and the bottom 10e of the hollow portion 10a. In this case, the silicon nitride film 18 protects the silicon oxide film 11 from being removed at a boundary between the sidewall 10d and the bottom 10e of the hollow portion 10a from the substrate 10.

Alternatively, the silicon nitride film 18 may be formed only on the boundary between the sidewall 10d and the bottom 10e of the hollow portion 10a and on a portion corresponding to the resistors 15a, 15b. In this case, the silicon nitride film 18 protects the silicon oxide film 11 from being removed from the substrate 10. Further, the silicon nitride film 18 prevents a Na atom, a $H_2O$ molecule and a OH group from being diffused at the insulation film 11 on the portion corresponding to the resistors 15a, 15b.

Alternatively, the silicon nitride film 18 may be formed on only the boundary between the sidewall 10d and the bottom 10e of the hollow portion 10a. In this case, the silicon nitride film 18 protects the silicon oxide film 11 from being removed at the boundary from the substrate 10.

Thus, when the silicon nitride film 18 is formed on only the boundary, the silicon nitride film 18 protects the silicon oxide film 11 from being removed at the boundary from the substrate 10.

Alternatively, the sensor S1 may include a silicon oxynitride film instead of the silicon nitride film 18. When the sensor S1 includes the silicon oxynitride film, the adhesiveness to the sidewall 10d and the bottom 10e of the hollow portion 10a of the substrate 10 is improved, compared with a case where the sensor S1 includes the silicon nitride film 18.

Alternatively, the sensor S1 may include an amorphous silicon film instead of the silicon nitride film 18. The amorphous silicon film can be deposited at a room temperature. Further, a growth rate of the amorphous film can be controlled to be small. Thus, the thickness of the amorphous silicon film is controlled with high accuracy.

Alternatively, the sensor S1 may include a metal film such as an aluminum film instead of the silicon nitride film 18. The metal film has high ductibility, compared with the silicon nitride film 18. Thus, in a case where the sensor S1 includes the metal film, even when the portion, on which the resistors 15a, 15b are formed, is deformed largely, the metal film protects the silicon oxide film 11 from being removed.

The silicon oxynitride film, the amorphous silicon film and the metal film prevent the Na atom, the $H_2O$ molecule and the OH group from being diffused.

Accordingly, the above films prevent from diffusion of the Na atom, the $H_2O$ molecule and the OH group in the insulation film, which contacts the above films. Thus, the detection accuracy of the sensor S1 is improved.

Further, when the silicon oxynitride film, the amorphous silicon film or the metal film is formed under the resistors 15a, 15b, the films prevent penetration of foreign particle such as heavy metal into the silicon oxide film 11. Thus, the above films protect resistivity of the resistors 15a, 15b from being changed.

Alternatively, in the step in FIG. 4A, the distance between the contact hole 21 and the pad may be lengthened. Further, the aluminum material embedded in the contact hole 21 may be used as a retrieve wiring, so that the retrieve wiring is electrically connected to the pad. In this case, the electric resistance between the aluminum material in the contact hole and the pad becomes small.

Second Embodiment

A thermal type gas flow sensor S1 according to a second embodiment includes a film instead of the silicon oxide film 11, the film having a gettering effect, so that the resistivity change of the resistors 15a, 15b is reduced.

After the hollow portion 10a is formed by the anisotropic etching method, an oxidizing and nitriding process is performed so that the silicon oxide film 11 on the bottom 10e of the hollow portion 10a is oxidized and nitrided. Thus, the silicon oxide film 11 is changed to a silicon oxynitride film. For example, the silicon oxide film 11 is heated at 1100° C. under $NH_3$ atmosphere so that the silicon oxide film 11 is transformed to the silicon oxynitride film.

The silicon oxynitride film has small diffusion coefficient. Thus, the Na atom, the $H_2O$ molecule and the OH group included in the silicon oxynitride film are not diffused largely.

Accordingly, the influence of the diffusion of the Na atom, the $H_2O$ molecule and the OH group on the resistivity of the resistors 15a, 15b is reduced.

Alternatively, the silicon oxide film as the BOX layer in the SOI substrate may be preliminary oxidized and nitrided so that the BOX layer is transformed to the silicon oxynitride film. In this case, it is not necessary to perform the oxidizing and nitriding process after the anisotropic etching process.

(Modifications)

The sensor S1 may include a PSG film or a BPSG film instead of the silicon oxide film 11.

The PSG film and the BPSG film have gettering effect regarding the Na atom or the like.

Accordingly, the Na atom is prevented from being diffused in the semiconductor layer 12, and the resistivity change of the resistors 15a, 15b is reduced. Here, since the BPSG film 14 is formed on the semiconductor layer 12, the gettering effect of the BPSG films 14 is much improved, so that the resistivity change is much reduced.

Other Embodiments

When the corrugation 13b of the silicon nitride film 13a is hardly formed, or when the influence of the corrugation 13b is small, the silicon nitride film 18 may be formed without removing the silicon nitride film 13a.

Alternatively, the heat treatment after the step of forming the silicon nitride film 18 may not be performed.

Alternatively, although the sensor is the thermal type gas flow sensor S1, the sensor may be a gas sensor having a heater for accelerating reaction with gas. Further, the sensor may be another sensor having a heater.

The above disclosure has the following aspects.

According to a first aspect of the present disclosure, a sensor includes: a silicon substrate having a hollow portion, which is arranged on a backside of the substrate; an insulation film disposed on a front side of the substrate and covering the hollow portion; a heater disposed on the insulation film, made of a semiconductor layer, and configured to generate heat; and an anti-stripping film for protecting the insulation film from being removed from the silicon substrate. The silicon substrate, the insulation film and the semiconductor layer provide a SOI substrate. The hollow portion has a sidewall and a bottom, and the anti-stripping film covers at least a boundary between the sidewall and the bottom of the hollow portion.

In the above sensor, even if stress is applied to the hollow portion, the stress is reduced by the anti-stripping film. Accordingly, the insulation film is hardly removed from the substrate, and thereby, the mechanical strength of the sensor is improved.

Alternatively, the anti-stripping film may be disposed on the bottom of the hollow portion under the heater. Thus, a region detected by the anti-stripping film becomes larger. Thus, the mechanical strength of the sensor is much improved. Alternatively, the anti-stripping film may be made of a silicon nitride film. Further, the anti-stripping film may have a thickness in a range between 0.1 microns and 2.0 microns. Furthermore, the anti-stripping film may have a thickness in a range between 0.35 microns and 2.0 microns. Alternatively, the anti-stripping film may be made of a silicon oxynitride film. In this case, adhesiveness of the silicon oxynitride film on the substrate is improved. Alternatively, the anti-stripping film may be made of an amorphous silicon film. Alternatively, the anti-stripping film may be made of a metal film. Alternatively, the insulation film may be made of a PSG (phosphor silicate glass) film or a BPSG (boron-doped phosphorus silicate glass) film. The PSG film and the BPSG film has gettering effect, and thereby, an Na atom or the like included in the semiconductor layer can be removed. Alternatively, the insulation film may be made of a silicon oxynitride film. Alternatively, the sensor may detect gas flow amount based on resistance change of the heater.

According to a second aspect of the present disclosure, a manufacturing method of a sensor includes: preparing a SOI substrate having a silicon substrate, an insulation layer and a semiconductor layer, which are stacked in this order; forming a heater in the semiconductor later so that the heater is arranged on the insulation layer; forming a mask on a backside of the silicon substrate; etching the backside of the silicon substrate via the mask so that a hollow portion is formed on the backside of the silicon substrate; and forming an anti-stripping film on a boundary between a sidewall and a bottom of the hollow portion. The insulation layer is disposed on a front side of the silicon substrate, and covers the hollow portion. The heater is configured to generate heat, and the anti-stripping film protects the insulation layer from being removed from the silicon substrate.

In the above method, even if stress is applied to the hollow portion, the stress is reduced by the anti-stripping film. Accordingly, the insulation film is hardly removed from the substrate, and thereby, the mechanical strength of the sensor is improved.

Alternatively, in the forming the anti-stripping film, the anti-stripping film may be formed on the bottom of the hollow portion under the heater. Alternatively, the method may further include: removing the mask by an etching process before the forming the anti-stripping film. Alternatively, the method may further include: performing a heat treatment after the forming the anti-stripping film. Alternatively, the anti-stripping film may be formed by a CVD method. Alternatively, the anti-stripping film may be formed by a sputtering method.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A sensor comprising:
a silicon substrate having a hollow portion, which is arranged on a backside of the silicon substrate;
an insulation film disposed on a front side of the silicon substrate and covering the hollow portion;
a heater disposed on the insulation film, made of a semiconductor layer, and configured to generate heat; and
an anti-stripping film for protecting the insulation film from being removed from the silicon substrate,
wherein the silicon substrate, the insulation film and the semiconductor layer provide a SOI substrate,
wherein the hollow portion has a sidewall and a bottom, and
wherein the anti-stripping film covers at least a boundary between the sidewall and the bottom of the hollow portion.

2. The sensor according to claim 1,
wherein the anti-stripping film is disposed on the bottom of the hollow portion under the heater.

3. The sensor according to claim 1,
wherein the anti-stripping film is made of a silicon nitride film.

4. The sensor according to claim 3,
wherein the anti-stripping film has a thickness in a range between 0.1 microns and 2.0 microns.

5. The sensor according to claim 4,
wherein the anti-stripping film has a thickness in a range between 0.35 microns and 2.0 microns.

6. The sensor according to claim 1,
wherein the anti-stripping film is made of a silicon oxynitride film.

7. The sensor according to claim 1,
wherein the anti-stripping film is made of an amorphous silicon film.

8. The sensor according to claim 1,
wherein the anti-stripping film is made of a metal film.

9. The sensor according to claim 1,
wherein the insulation film is made of a PSG film or a BPSG film.

10. The sensor according to claim 1,
wherein the insulation film is made of a silicon oxynitride film.

11. The sensor according to claim 1, wherein the sensor detects gas flow amount based on resistance change of the heater.

12. The sensor according to claim 1, further comprising:
an insulation film disposed on the silicon substrate to cover the semiconductor layer.

13. The sensor according to claim 12,
wherein the insulation film includes a BPSG film and a silicon nitride film,
wherein the semiconductor layer is sealed with the BPSG film, and
wherein the silicon nitride film covers the BPSG film.

14. The sensor according to claim 1,
wherein the anti-stripping film is disposed on the backside of the silicon substrate, and
wherein the anti-stripping film contacts the insulation film at the bottom of the hollow portion.

* * * * *